United States Patent
Cheng et al.

(10) Patent No.: US 11,127,803 B2
(45) Date of Patent: Sep. 21, 2021

(54) DISPLAY PANEL AND DISPLAY DEVICE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 260 days.

(21) Appl. No.: 16/308,657

(22) PCT Filed: Jun. 8, 2018

(86) PCT No.: PCT/CN2018/090352
§ 371 (c)(1),
(2) Date: Dec. 10, 2018

(87) PCT Pub. No.: WO2019/041954
PCT Pub. Date: Mar. 7, 2019

(65) Prior Publication Data
US 2020/0321417 A1    Oct. 8, 2020

(30) Foreign Application Priority Data
Aug. 30, 2017 (CN) .......................... 201710766221.3

(51) Int. Cl.
*H01L 27/32* (2006.01)
(52) U.S. Cl.
CPC ...... *H01L 27/3262* (2013.01); *H01L 27/3246* (2013.01); *H01L 27/3265* (2013.01); *H01L 27/3276* (2013.01); *H01L 2227/323* (2013.01)

(58) Field of Classification Search
CPC ............. H01L 27/3262; H01L 27/3265; H01L 27/3251
See application file for complete search history.

(56) References Cited

U.S. PATENT DOCUMENTS 6,576,924 B1   6/2003   Yamazaki et al.
7,817,214 B2   10/2010  Lee
(Continued)

FOREIGN PATENT DOCUMENTS

CN    1188368 A     7/1998
CN    101017294 A   8/2007
(Continued)

OTHER PUBLICATIONS

Search Report and Written Opinion for International Application No. PCT/CN2018/090352 dated Aug. 22, 2018.
(Continued)

*Primary Examiner* — Jay C Chang
*Assistant Examiner* — Mikka Liu
(74) *Attorney, Agent, or Firm* — Calfee, Halter & Griswold LLP

(57) ABSTRACT

A display panel includes an array substrate and a package substrate disposed opposite to each other, wherein, the array substrate includes a plurality of pixel units arranged in an array, and at least one of the pixel units includes a driving transistor. Further, the package substrate includes a first electrode and a second electrode disposed opposite to each other and an insulating layer located between the two electrodes. Wherein, the first electrode is electrically connected to the first terminal of the driving transistor, and the second electrode is electrically connected to the control terminal of the driving transistor.

12 Claims, 4 Drawing Sheets

(56) References Cited

U.S. PATENT DOCUMENTS

2007/0206125 A1    9/2007  Lee
2007/0252152 A1*  11/2007  Sato .................... H01L 27/1255
                                                           257/71
2018/0175077 A1*   6/2018  Koo .................... H01L 27/1251

FOREIGN PATENT DOCUMENTS

| | | |
|---|---|---|
| CN | 101064323 A | 10/2007 |
| CN | 103064218 A | 4/2013 |
| EP | 1850386 A1 | 10/2007 |
| KR | 20030015409 A | 2/2003 |
| KR | 100397877 B1 | 9/2003 |

OTHER PUBLICATIONS

First Office Action for Chinese Patent Application No. 201710766221.3 dated Mar. 19, 2020.

* cited by examiner

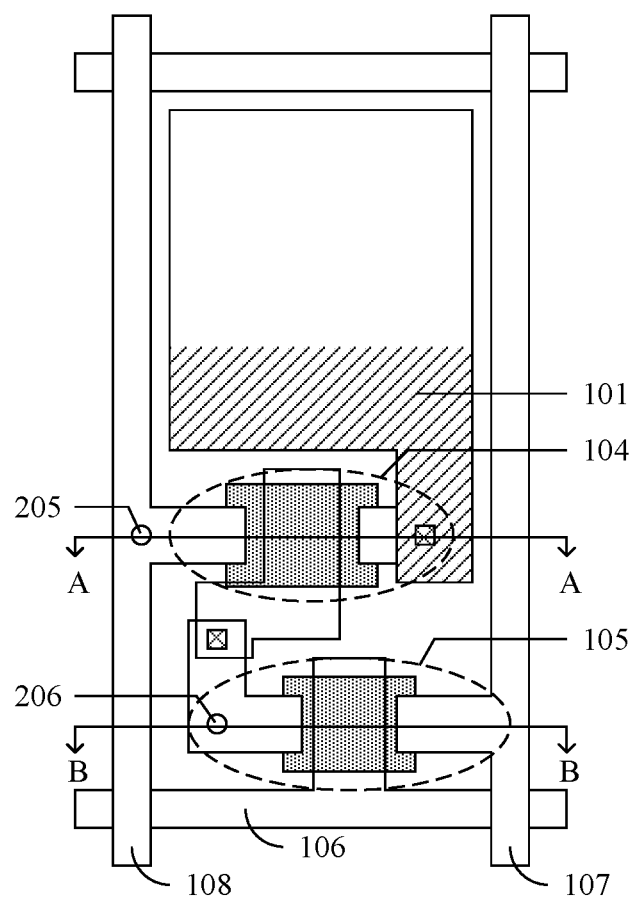
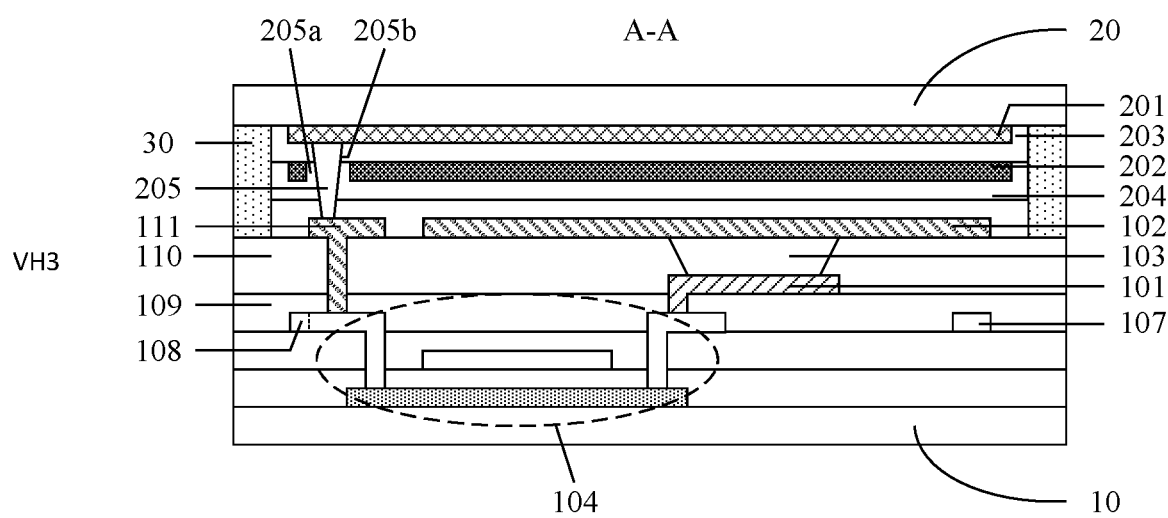
Fig. 3
Fig. 4

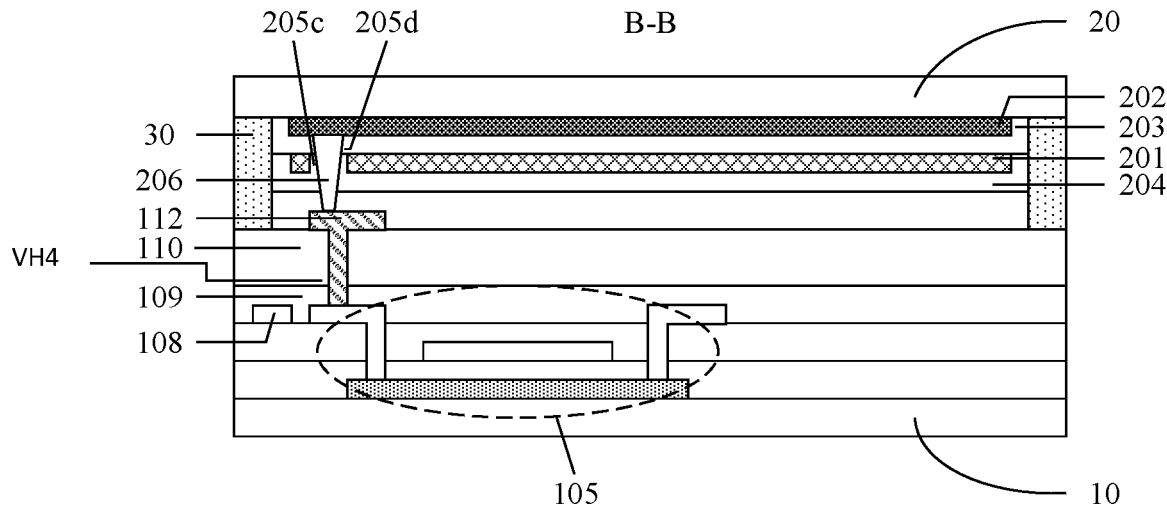

Fig. 7

| Providing a first substrate, and on the first substrate, forming a plurality of pixel units arranged in an array, the pixel unit including a driving transistor 104; a third electrode 101 electrically connected to the second terminal of the driving transistor 104; a fourth electrode 102 opposite to the third electrode 101, and an organic light-emitting layer 103 between the two electrodes | S1 |

↓

| Providing a second substrate, and on the second substrate, forming a first electrode 201 and a second electrode 202 that are opposite to each other, an insulating layer 203 between the first and second electrodes, and a passivation layer 204 located on the outer most side | S2 |

↓

| Applying encapsulant 30 on the peripheral region of the first substrate, and compressing the first substrate and the second substrate so that the first electrode 201 and the first terminal of the driving transistor 104 are electrically connected, and the second electrode 202 and the control terminal of the driving transistor 104 are electrically connected, solidifying the encapsulant 30 by ultraviolet light irradiation, thereby completing the packaging of the OLED display panel | S3 |

Fig. 8

DISPLAY PANEL AND DISPLAY DEVICE

CROSS REFERENCE

This application is the national phase application of PCT/CN2018/090352, filed on Jun. 8, 2018 which is based upon and claims priority to Chinese Patent Application No. 201710766221.3, filed on Aug. 30, 2017, the entire contents thereof are incorporated herein by reference.

TECHNICAL FIELD

The present disclosure relates to the field of display technology, and particularly to a display panel and method for manufacturing the same, a display device.

BACKGROUND

OLED (Organic Light Emitting Diode), which is a current-type light-emitting device, has been widely used in the display field of high-performance. OLED is advantageous in self-luminous, fast response, wide viewing angle, and applicable on flexible substrates etc. According to driving methods, OLEDs can be classified into a PMOLED (Passive Matrix Driving OLED) and an AMOLED (Active Matrix Driving OLED). Among them, the AMOLED display device has a wide market application and has become one of the most popular display devices.

Among the AMOLED display devices, the bottom emission type OLED displays are mainly applied to large-sized displays such as, an OLED television, but a large-sized OLED display has always had a problem of a low aperture ratio. Taking an OLED structure of 2T1C (2 transistors and 1 capacitor) as an example, referring to FIG. 1 and FIG. 2, in the pixel structure of the bottom emission type OLED display device, since the two electrodes 01 and 02 of the storage capacitor Cs are usually provided between two adjacent transistors along the direction of the data signal line Data, and forming the storage capacitor Cs with a gate metal layer of the driving transistor DT and another metal layer such as a metal layer of a power signal line Vdd, respectively, thus a certain area has to be occupied, and therefore, the aperture ratio of the OLED device will be significantly affected.

It is to be understood that the information disclosed in the background only serves for enhancement of understanding of the background of the present disclosure, and thus may include information that does not constitute a related art known to those of ordinary skill in the art.

SUMMARY

An object of the present disclosure is to provide a display panel and method for manufacturing the same, a display device.

Other features and advantages of the present disclosure will be apparent form the following detailed description, or learned in part by the practice of the present disclosure.

According to an aspect of the present disclosure, a display panel is provided, the display panel comprising an array substrate and a package substrate provided opposite to each other, the array substrate comprising a plurality of pixel units arranged in an array, and the pixel units comprising a driving transistor, a first electrode and a second electrode provided between the package substrate and the array substrate, and an insulating layer provided between the first electrode and the second electrode, wherein, the first electrode is electrically connected to a first terminal of the driving transistor, and the second electrode is electrically connected to a control terminal of the driving transistor.

In an exemplary embodiment of the present disclosure, the array substrate comprises a first auxiliary electrode electrically connected to the first terminal of the driving transistor, the package substrate also comprises the first conductive pillar electrically connected to the first electrode, wherein, the first conductive pillar is electrically connected to the first auxiliary electrode.

In an exemplary embodiment of the present disclosure, the first electrode is located on a side of the second electrode facing away from the array substrate, the second electrode is provided with a first opening at a position of the first conductive pillar, and the insulating layer is provided with a first via at a position corresponding to the first conductive pillar, further, the first conductive pillar is in contact with the first auxiliary electrode through the first opening and the first via, wherein, a size of the first opening is larger than a size of the first via, so that the first conductive pillar and the second electrode are electrically insulated.

In an exemplary embodiment of the present disclosure, the second electrode is provided on the package substrate, and the first electrode is located on a side of the second electrode adjacent to the array substrate, the first conductive pillar is in contact with the first auxiliary electrode.

In an exemplary embodiment of the present disclosure, the array substrate further comprises a control transistor of which the first terminal is electrically connected to the control terminal of the driving transistor, and a second auxiliary electrode in contact with the first terminal of the control transistor, the package substrate further comprises a second conductive pillar in contact with the second electrode.

wherein, the second conductive pillar is electrically connected to the second auxiliary electrode.

In an exemplary embodiment of the present disclosure, the first electrode is located on a side of the second electrode facing away from the array substrate, the second conductive pillar is in contact with the second auxiliary electrode.

In an exemplary embodiment of the present disclosure, the first electrode is located on a side of the second electrode adjacent the array substrate, the first electrode is provided with a second opening at a position of the second conductive pillar, and the insulating layer is provided with a second via at a position corresponding to the second conductive pillar, further, the second conductive pillar is in contact with the second auxiliary electrode through the second opening and the second via.

wherein, a size of the second opening is larger than a size of the second via, so that the electrical connection between the second conductive pillar and the first electrode is electrically insulated.

In an exemplary embodiment of the present disclosure, the pixel units further comprise a third electrode electrically connected to the second terminal of the driving transistor and a fourth electrode provided opposite to the third electrode, wherein, the first auxiliary electrode is provided in the same layer as the fourth electrode.

In an exemplary embodiment of the present disclosure, the pixel units further comprise a third electrode electrically connected to the second terminal of the driving transistor and a fourth electrode provided opposite to the third electrode, wherein, the second auxiliary electrode is provided in the same layer as the fourth electrode.

In an exemplary embodiment of the present disclosure, the array substrate further comprises a protective layer and a pixel defining layer provided in sequence above the driving transistor, the first auxiliary electrode is in contact with the first terminal of the driving transistor through a third via that penetrates the protective layer and the pixel defining layer.

In an exemplary embodiment of the present disclosure, the array substrate further comprises a protective layer and a pixel defining layer provided in sequence above the driving transistor, the second auxiliary electrode is in contact with the first terminal of the control transistor through a fourth via that penetrates the protective layer and the pixel defining layer.

In an exemplary embodiment of the present disclosure, the array substrate further comprises a plurality of scanning signal lines arranged along a first direction and a plurality of data signal lines and power signal lines arranged along a second direction, wherein, the first direction is perpendicular to the second direction, wherein, the control terminal of the control transistor is electrically connected to the scan signal lines, and the second terminal is electrically connected to the data signal lines, and the first terminal of the driving transistor is further electrically connected to the power signal lines.

According to an aspect of the present disclosure, providing a manufacturing method of a display panel, the manufacturing method comprising, providing a first substrate, and forming a plurality of pixel units on the first substrate arranged in an array, wherein, at least one of the pixel units is formed with a driving transistor, providing a second substrate, and on the second substrate, forming a first electrode and a second electrode, and an insulting layer between the first electrode and the second electrode on the outermost side, performing cell aligning of the first substrate and the second substrate, so that the first electrode is electrically connected to a first terminal of the driving transistor, and the second electrode is electrically connected to a control terminal of the driving transistor.

In an exemplary embodiment of the present disclosure, the manufacturing method further comprising, forming a first auxiliary electrode on the first substrate in contact with the first terminal of the driving transistor, forming a first conductive pillar on the second substrate in contact with the first electrode, when cell aligning of the first substrate and the second substrate is performed, bring the first conductive pillar in contact with the first auxiliary electrode.

In an exemplary embodiment of the present disclosure, the first electrode is located on a side of the second electrode facing away from the first substrate, forming the first conductive pillar in contact with the first electrode comprises, forming a first via on the insulating layer at a position corresponding the first conductive pillar, forming a first opening on the second electrode at a position of the first conductive pillar, and forming the first conductive pillar, so that the first conductive pillar is in contact with the first electrode through the first opening and the first via, wherein, a size of the first opening is larger than a size of the first via, so that the first conductive pillar and the second electrode are electrically insulated.

In an exemplary embodiment of the present disclosure, the manufacturing method further comprising, forming a control transistor on the first substrate with a first terminal electrically connected to the control terminal of the control transistor, and a second auxiliary electrode on the first substrate in contact with the first terminal of the control transistor, forming a second conductive electrode on the second substrate in contact with the second electrode, when the cell aligning of the first substrate and the second substrate is performed, bring the second conductive pillar in contact with the second auxiliary electrode.

In an exemplary embodiment of the present disclosure, the first electrode is located on a side of the second electrode adjacent the first substrate, forming the second conductive pillar in contact with the second electrode comprises, forming a second via on the insulating layer at a position corresponding the second conductive pillar, forming a second opening on the first electrode at a position of the second conductive pillar, and forming the second conductive pillar, so that the second conductive pillar is in contact with the second electrode through the second opening and the second via, wherein, a size of the second opening is larger than a size of the second via, so that the electrical connection between the second conductive pillar and the first electrode is electrically insulated.

In an exemplary embodiment of the present disclosure, the manufacturing method further comprising, forming a third electrode on the first substrate electrically connected to the driving transistor and a fourth electrode corresponding to the third electrode, wherein, the first auxiliary electrode and the fourth electrode are formed by the same patterning process.

In an exemplary embodiment of the present disclosure, the manufacturing method further comprising, forming a third electrode on the first substrate electrically connected to the driving transistor and a fourth electrode corresponding to the third electrode, wherein, the second auxiliary electrode and the fourth electrode are formed by the same patterning process.

According to an aspect of the present disclosure, providing a display device, comprising the above display panel.

It should be understood that, the above general description and the following detailed description are intended to be exemplary and explanatory, and not to limit the present disclosure.

BRIEF DESCRIPTION OF THE DRAWINGS

The accompanying drawings herein, which are incorporated into the specification and form part of the specification, illustrate the embodiments of the present disclosure, and serve to explain the principles of the present disclosure together with the specification. It is apparent that, the drawings in the following description are only some of the embodiments of the present disclosure, and other variants may be obtained according to these drawings, for those skilled in the art without creative labor.

FIG. 3 schematically shows a schematic diagram of planar structure of an OLED pixel in an exemplary embodiment of the present disclosure;

FIG. 4 schematically shows a schematic diagram of A-A cross section of an OLED pixel in an embodiment of the present disclosure;

FIG. 7 schematically shows a schematic diagram of B-B cross section of an OLED pixel in another embodiment of the present disclosure; and FIG. 8 schematically shows a flow chart of manufacturing method of the display panel in an exemplary embodiment of the present disclosure.

DETAILED DESCRIPTION

Figure 1:
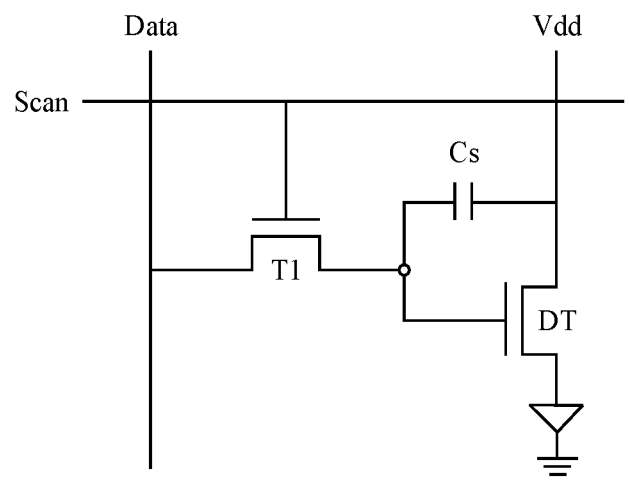
FIG. 1 schematically shows a schematic circuit diagram of an OLED pixel in the related art.
Figure 2:
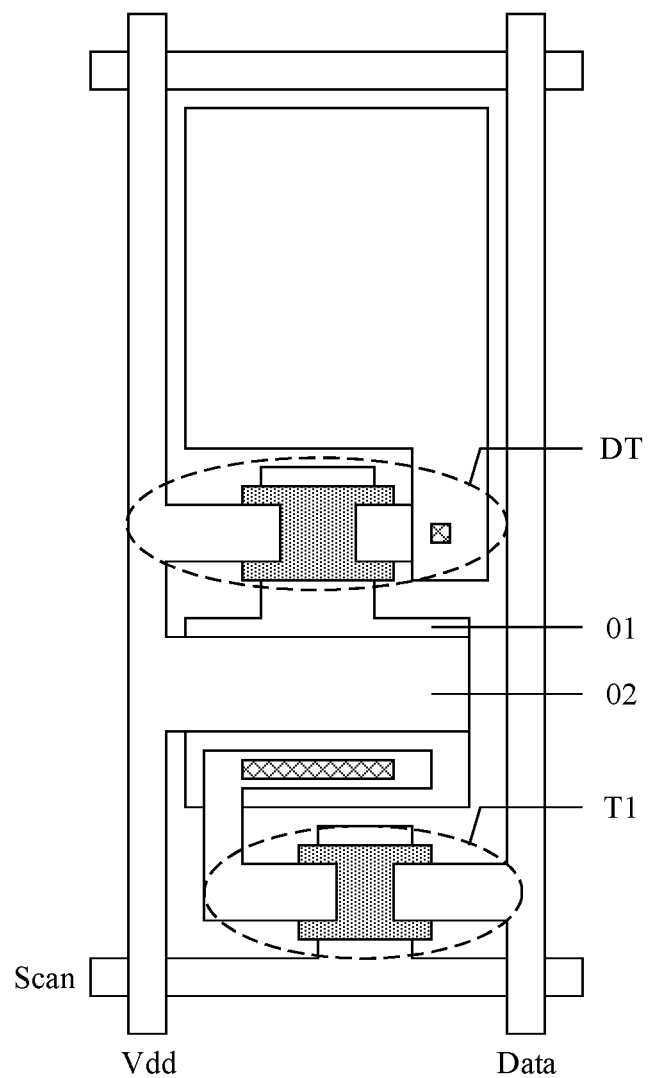
FIG. 2 schematically shows a schematic structural diagram of an OLED pixel in the related art.

The exemplary embodiments of the present disclosure will now be described more fully with reference to accompanying drawings. However, the exemplary embodiments of the present disclosure may be embodied in a variety of forms, and should not be construed as being limited to the examples set forth herein. Contrarily, these embodiments are provided so that the present disclosure will be more complete and comprehensive, and the concepts of the exemplary embodiments are fully conveyed to those skilled in the art. The described features, structures, or characteristics may be combined in any suitable manner in one or more embodiments of the present disclosure. In the following description, many specific details are provided to give a full understanding of the embodiments of the present disclosure. However, those skilled in the art will appreciate that the technical proposal of the present disclosure may be practiced and omitted one or more of the specific details, or use other methods, components, devices, steps, etc. In other instances, well-known technical proposals are not illustrated or described in detail to avoid obscuring aspects of the present disclosure.

In addition, the accompanying drawings are merely schematic diagram illustrating of the present disclosure, and are not necessarily drawn in scale. The thicknesses and shapes of the various layers in the accompanying drawings do not reflect the true proportions and are merely for the convenience of illustrating the contents of the present disclosure. The same reference numerals in the figures represent the same or similar parts, and therefore repetitive descriptions thereof will be omitted.

In the following exemplary embodiment, a display panel is provided, for which an OLED display panel is taken as an example. As shown in FIG. 3 and FIG. 7, the OLED display panel comprises an array substrate 10 and a package substrate 20 provided opposite to each other, an encapsulant 30 located between the array substrate and the package substrate, and an inert gas or resin filled in the encapsulant 30. Wherein, the encapsulant 30 can be solidified under ultraviolet light to realize packaging of the OLED display panel.

The array substrate 10 may comprise a plurality of the pixel units arranged in an array, and the pixel units may comprise a third electrode 101 and a fourth electrode 102, an organic light-emitting layer 103 located between the third and fourth electrodes, and a driving transistor 104 configured to control the OLED light-emitting unit. And the third electrode 101, the fourth electrode 102, and the organic light-emitting layer 103 between these two electrodes may together constitute an OLED light-emitting unit.

Between the package substrate 20 and the array substrate 10, there may be provided with a first electrode 201 and a second electrode 202 and an insulating layer 203 located between these two electrodes, and a passivation layer 204 located on the most outside. And the first electrode 201 and the second electrode 202 may constitute a storage capacitor Cs.

In an embodiment, the first electrode 201 may be electrically connected to the first terminal of the driving transistor 104, and the second electrode 201 may be electrically connected to the control terminal of the driving transistor 104, and the third electrode 101 may be electrically connected to the second terminal of the driving transistor 104.

It should be noted that the driving transistor 104 may be an enhancement transistor or a depletion transistor according to different conductivity modes of the transistors. Moreover, the driving transistor 104 may be a bottom gate transistor of a top gate transistor depending on the type of the structure of transistor. The active layer of the driving transistor 104 may be any one of single crystal silicon, polycrystalline silicon, or metal oxide semiconductor. The present disclosure is not limited thereto.

In the OLED display panel according to the exemplary embodiment of the present disclosure, by disposing the first electrode 201 and the second electrode 202 on the package substrate 20 constituting the storage capacitor Cs, and electrically connecting the two electrode to the first terminal and the control terminal of the driving transistor 104 in the OLED pixel units respectively, so that the storage capacitor Cs is not required to be formed by using metal layers on the array substrate 10, thereby, significantly improving the aperture ratio of the OLED device. Since the storage capacitor Cs is not disposed directly on the array substrate 10, but on the package substrate 20, so that the size of the two electrodes constituting the storage capacitor Cs can be arbitrarily set without affecting the aperture ratio of the OLED device.

Based on the above structure, in the region of at least one of the pixel units, the first electrode 201 and the second electrode 202 may both be plate-shaped electrodes, or may both comprise a plurality of block-shaped electrodes with electrically connected, or one of them is a plate-shaped electrode, and the other comprises a plurality of block-shaped electrodes with electrically connected, as long as the relative areas between the two electrodes can form a capacitor. Wherein, in the bottom emission type OLED display panel, the first electrode 201 and the second electrode 201 may both be a metal electrode such as a magnesium electrode, a silver electrode, or an aluminum electrode, etc.

FIG. 3 is an illustrating schematic diagram of planar structure of an OLED pixel in an exemplary embodiment of the present disclosure. As can be seen from this figure, the array substrate 10 may comprise a plurality of scanning signal lines Scan106 extending in a first direction, and a plurality of data signal lines Data107 extending in a second direction, and a plurality of power signal lines Vdd108. Wherein, the first direction and the second direction are perpendicular to each other.

Based on this, at least one of the pixel units of the array substrate 10 may further comprise a control transistor 105 provided to control the switching of the driving transistor 104. The control terminal of the control transistor 105 is electrically connected to the scan signal lines Scan106, and the first terminal of the control transistor 105 is electrically connected to the control terminal of the driving transistor 104, and the second terminal of the control transistor 105 is electrically connected to the data signal lines Data107. Moreover, the first terminal of the driving transistor 104 is electrically connected to the power signal lines Vdd108, and the second terminal of the driving transistor 104 is electrically connected to the third electrode 101.

It should be noted that the control transistor 105 may be an enhancement transistor or a depletion transistor according to a different conductivity mode of the transistor. Moreover, the control transistor 105 may be a bottom gate transistor of a top gate transistor depending on the type of the structure of transistor. The active layer of the control transistor 105 may be any one of single crystal silicon, polycrystalline silicon, or metal oxide semiconductor. The present disclosure is not limited thereto.

In addition, the control terminal, the first terminal and the second terminal of at least one transistor in the present embodiment may be, for example, a gate electrode, a source electrode, and a drain electrode. The source and drain electrodes are structurally symmetrical to each other.

In an exemplary embodiment, referring to FIG. 4, the array substrate 10 may further comprise a protective layer 109 overlying the driving transistor 104 and the control transistor 105, and a pixel defining layer 110 above the protective layer 109. Wherein, the organic light-emitting layer 103 between the third electrode 101 and the fourth electrode 102 may be formed in a region defined by the pixel defining layer 110 by using, for example, evaporation method.

Based on this, the array substrate 10 may further comprise the first auxiliary electrode 111 that is in contact with the first terminal of the driving transistor 104. The first auxiliary electrode 111 may be in contact with the first terminal of the driving transistor 104 through a third via VH3 that penetrates the protective layer 109 and the pixel defining layer 110. Wherein, the first auxiliary electrode 111 may be disposed in the same layer as the fourth electrode 102 and has same material with the fourth electrode 102. For example, the first auxiliary electrode 111 and the fourth electrode 102 may be patterned with different patterns by a same patterning process on the same metal layer. The patterning process described herein refers to performing process of exposing, developing, etching, etc., on a film by using a reticle method.

The first electrode 201 in the package substrate 20 may be located on a side of the second electrode 202 facing away from the array substrate 10. Based on this, the package substrate 20 may further comprise a first conductive pillar 205 in contact with the first electrode 201. A first opening 205a is provided in the second electrode 202 at a position corresponding to that of the first conductive pillar 205. A first via 205b is provided at a position of the insulating layer 203 corresponding to that of the first conductive pillar 205. The first via 205b penetrates a passivation layer 204. The first conductive pillar 205 may pass through the first opening 205a in the second electrode 202 and the first via 205b in the insulating layer 203 and the passivation layer 204 and contact with the first auxiliary electrode 111 on the array substrate 10. Wherein, the size of the first opening 205a in the second electrode 202 is larger than the size of the first via 205b in the insulating layer 203 and the passivation layer 204 so as to electrically insulate the first conductive pillar 205 from the second electrode 202.

Based on this, by providing the first auxiliary electrode 111 on the array substrate 10, and providing the first conductive pillar 205 on the package substrate 20, realizing the mutual contact between the first auxiliary electrode 111 and the first conductive pillar 205 after cell aligning of the two substrates, thus, a voltage may be supplied to an electrode of the storage capacitor Cs, for example, the first electrode 201.

Figure 5:
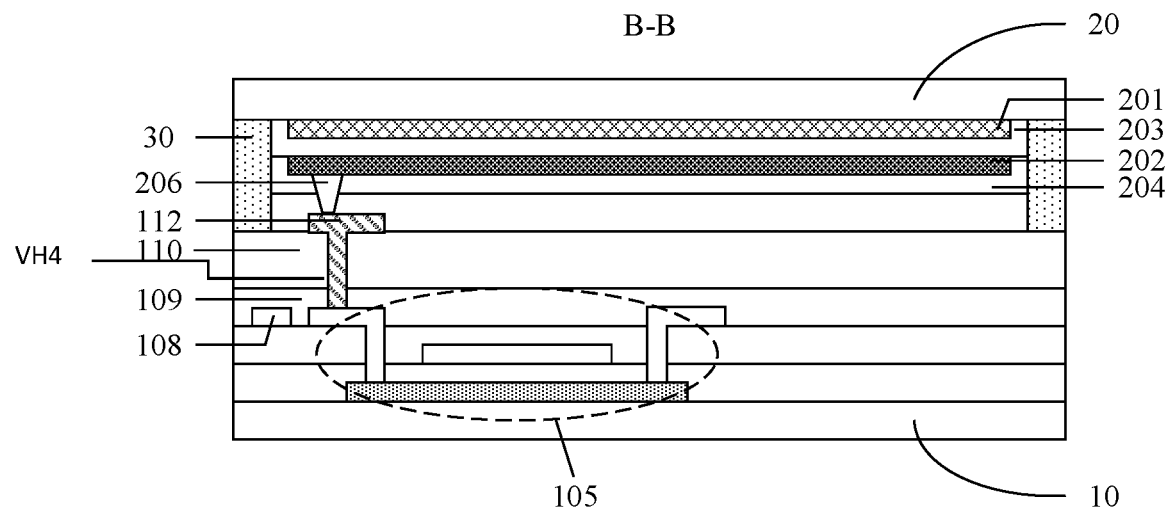
FIG. 5 schematically shows a schematic diagram of B-B cross section of an OLED pixel in an embodiment of the present disclosure.

In the present exemplary embodiment, referring to FIG. 5, the array substrate 10 may further comprise the second auxiliary electrode 112 that is in contact with the first terminal of the control transistor 105. The first terminal of the control transistor 105 is electrically connected to the control terminal of the control transistor 104. The second auxiliary electrode 112 may be in contact with the first terminal of the control transistor 105 through a fourth via VH4 that penetrates the protective layer 109 and the pixel defining layer 110. Wherein, the second auxiliary electrode 112 may be disposed in the same layer as the fourth electrode 102 and has the same material with the fourth electrode 102. For example, the patterns of the second auxiliary electrode 112 and the fourth electrode 102 may be different from each other, but both of them are formed by the same patterning process on the same metal layer.

The first electrode 201 in the package substrate 20 may be located on a side of the second electrode 20 facing away from the array substrate 10. Based on this, the package substrate 20 may further comprise a second conductive pillar 206 in contact with the second electrode 202. The second conductive pillar 206 may be in contact with the second auxiliary electrode 112 by a fifth via which penetrating through the passivation layer 204.

Based on this, by providing the second auxiliary electrode 112 on the array substrate 10, and providing the second conductive pillar 206 on the package substrate 20, realizing the mutual contact between the second auxiliary electrode 112 and the second conductive pillar 206 after cell aligning of the two substrates, thus, a voltage may be supplied to another electrode of the storage capacitor Cs, for example, the second electrode 202.

It should be noted that, "above" in the present disclosure is based on the sequence of the manufacturing process, that is, the structure formed later is above the structure formed first, and such a relative position has no relationship with the upper and lower relative positions as shown in the accompanying figures.

In the OLED display panel provided by the present exemplary embodiments, the two embodiments in FIG. 4 and FIG. 5 may coexist or may exist separately, and are not specifically limited herein.

In this way, the first auxiliary electrode 111 and the first conductive pillar 205 may connect an electrode of the storage capacitor Cs, such as the first electrode 201, to the first terminal of the driving transistor 104, such as the source electrode. The second auxiliary electrode 112 and the second conductive pillar 206 may connect another electrode of the storage capacitor Cs, such as the second electrode 202, to the control terminal of the driving transistor 104, such as the gate electrode, thereby realizing the energy storage function of the storage capacitor Cs. Since the first electrode 201 is electrically connected to the first terminal of the driving transistor 104 through the first opening 205a in the second electrode 202, the effective relative areas of the first electrode 201 and the second electrode 202 on the package substrate 20 that constitute the storage capacitor Cs can be maximized.

Figure 6:
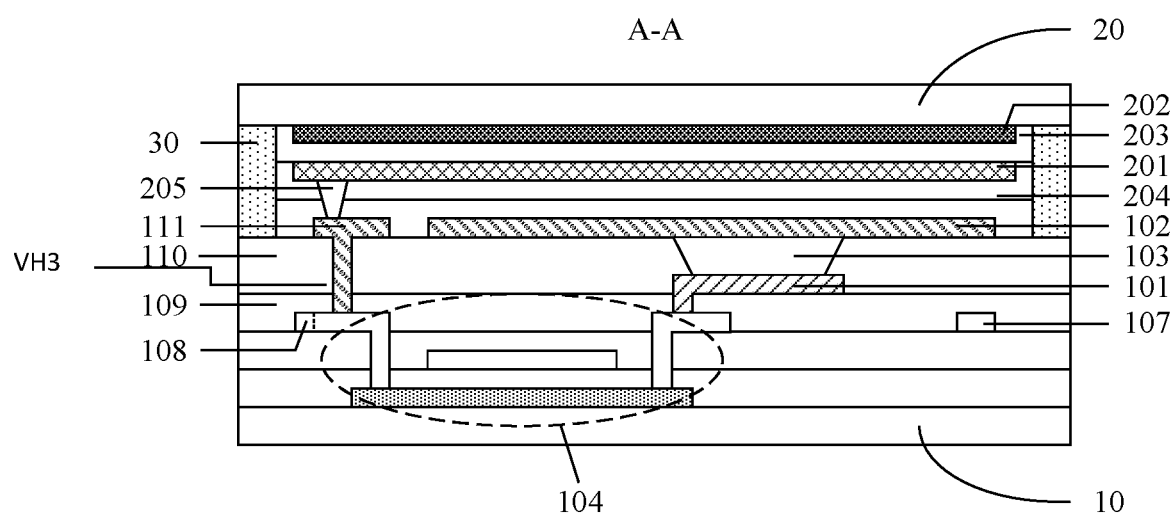
FIG. 6 schematically shows a schematic diagram of A-A cross section of an OLED pixel in another embodiment of the present disclosure.

In another exemplary embodiment, as shown in FIG. 6, the array substrate 10 may further comprise the protective layer 109 overlying the driving transistor 104 and the control transistor 105 and the pixel defining layer 110 above the protective layer 109. Wherein, the organic light-emitting layer 103 between the third electrode 101 and the fourth electrode 102 may be formed in a region defined by the pixel defining layer 110 by using, for example, evaporation method.

Based on this, the array substrate 10 may further comprise the first auxiliary electrode 111 that is in contact with the first terminal of the driving transistor 104. The first auxiliary electrode 111 may be in contact with the first terminal of the driving transistor 104 through the third via VH3 that penetrates the protective layer 109 and the pixel defining layer 110. Wherein, the first auxiliary electrode 111 may be disposed in the same layer as the fourth electrode 102 and has the same material with the fourth electrode 102. For example, the patterns of the first auxiliary electrode 111 and the fourth electrode 102 may be different from each other, but both of them may be formed by the same patterning process on the same metal layer. The patterning process described herein refers to performing processes of exposing, developing, etching, etc., on a film by using a reticle method.

The first electrode 201 in the package substrate 20 may be located on a side of the second electrode 202 adjacent to the array substrate 10. Based on this, the package substrate 20 may further comprise the first conductive pillar 205 in contact with the first electrode 201. And the first conductive pillar 205 may be in contact with the first auxiliary electrode 111 through a sixth via that penetrates the passivation layer 204.

Based on this, by providing the first auxiliary electrode 111 on the array substrate 10, providing the first conductive pillar 205 on the package substrate 20, and realizing the mutual contact between the first auxiliary electrode 111 and the first conductive pillar 205 after cell aligning of the two substrates, thus, a voltage may be supplied to an electrode of the storage capacitor Cs, for example, the first electrode 201.

In the present exemplary embodiment, referring to FIG. 7, the array substrate 10 may further comprise the second auxiliary electrode 112 that is in contact with the first terminal of the control transistor 105. The first terminal of the control transistor 105 is electrically connected to the control terminal of the control transistor 104. The second auxiliary electrode 112 may be in contact with the first terminal of the control transistor 105 through a fourth via VH4 that penetrates the protective layer 109 and the pixel defining layer 110. Wherein, the second auxiliary electrode 112 may be disposed in the same layer as the fourth electrode 102 and has the same material with the fourth electrode 102. For example, the patterns of the second auxiliary electrode 112 and the fourth electrode 102 may be different from each other, but both of them may be formed by the same patterning process for the same metal layer.

The first electrode 201 in the package substrate 20 may be located on a side of the second electrode 20 adjacent to the array substrate 10. Based on this, the package substrate 20 may further comprise a second conductive pillar 206 in contact with the second electrode 202. A second opening 205c is provided in the first electrode 201 at a position corresponding to that of the second conductive pillar 206. A second via 205d is provided in the insulating layer 203 at a position corresponding to that of the second conductive pillar 206. And the second via 205d also penetrates the passivation layer 204. The second conductive pillar 206 may be in contact with the second auxiliary electrode 112 on the array substrate 10 through the second opening 205c in the first electrode 201 and the second via 205d in the insulating layer 203 and the passivation layer 204. Wherein, the size of the second opening 205c in the first electrode 201 is larger than the size of the second via 205d in the insulating layer 203 and the passivation layer 204 so as to electrically insulate the second conductive pillar 206 from the first electrode 201.

Based on this, by providing the second auxiliary electrode 112 on the array substrate 10, and providing the second conductive pillar 206 on the package substrate 20, realizing the mutual contact between the second auxiliary electrode 112 and the second conductive pillar 206 after cell aligning of the two substrates, thus, a voltage may be supplied to another electrode of the storage capacitor Cs, for example, the second electrode 202.

It should be noted that, "above" in the present disclosure is explained based on the sequence of the manufacturing process, that is the structure formed first is below the structure formed later, and that has no absolute relationship with the upper and lower relative positions shown in the accompanying figures.

In the OLED display panel provided by the present exemplary embodiments, the two embodiments in FIG. 6 and FIG. 7 may coexist or may exist separately, and are not specifically limited herein.

In this way, the first auxiliary electrode 111 and the first conductive pillar 205 may connect an electrode of the storage capacitor Cs, such as the first electrode 201, to the first terminal of the driving transistor 104, such as the source electrode. And the second auxiliary electrode 112 and the second conductive pillar 206 may connect another electrode of the storage capacitor Cs, such as the second electrode 202, to the control terminal of the driving transistor 104, such as the gate electrode, thereby realizing the energy storage function of the storage capacitor Cs. Since the second electrode 202 is electrically connected to the first terminal of the control transistor 105 through the second opening 205c in the first electrode 201, thereby the second electrode 202 is electrically connected to the driving transistor 104, thus effective relative areas of the first electrode 201 and the second electrode 202 on the package substrate 20 that constitute the storage capacitor Cs can be maximized.

It should be noted that, the present exemplary embodiment is described by taking the structure of 2T1C OLED pixel as an example, but the same supplies to circumstances where a plurality of transistors and a plurality of capacitors are comprised. When a plurality of capacitors is present, the number of capacitors may be effectively reduced by the technical proposal of the present exemplary embodiment, thereby increasing the aperture ratio of the OLED device.

The present exemplary embodiment also provides a manufacturing method of an OLED display panel, as shown in FIG. 8, the manufacturing method may comprise the steps as described hereinafter.

In S1, a first substrate is provided. A plurality of pixel units is formed on the first substrate arranged in an array, and the pixel unit comprises a driving transistor 104. A third electrode 101 is formed electrically connected to the second terminal of the driving transistor 104, a fourth electrode 102 is formed opposite to the third electrode 101, and an organic light-emitting layer 103 is formed between the two electrodes.

In S2, a second substrate is provided. On the second substrate, there are formed with the first electrode 201 and the second electrode 202 that are opposite to each other, the insulating layer 203 located between the two electrodes, and the passivation layer 204 located on the most outside.

In S3, encapsulant 30 is applied on the peripheral region of the first substrate, and compressing the first substrate and the second substrate to electrically connect the first electrode 201 and the first terminal of the driving transistor 104, and to electrically connect the second electrode 202 and the control terminal of the driving transistor 104. The encapsulant 30 is solidified by ultraviolet light irradiation, thereby completing the packaging of the OLED display panel.

The manufacturing method of the OLED display panel is provided by the exemplary embodiment of the present disclosure is beneficial in that, by manufacturing the first electrode 201 and the second electrode 202 on the package substrate 20 to form the storage capacitor Cs, and electrically connecting the two electrodes to the first terminal and the control terminal of the driving transistor 104 respectively, it is not necessary to use the metal layers on the array substrate 10 to form the storage capacitor Cs, thereby significantly improving the aperture ration of the OLED device.

It should be noted that an inert gas or a resin may be filled between the first substrate and the second substrate before the packaging of OLED display panel is completed.

In an exemplary embodiment, referring to FIG. 4, in order to realize an electrical connection between an electrode of the storage capacitor Cs, for example, the first electrode 201, and the first terminal of the driving transistor 104, the manufacturing method may comprise the steps as described hereinafter.

The first auxiliary electrode 111 is formed on the first substrate and is in contact with the first terminal of the driving transistor 104. The first conductive pillar 205 is formed on the second substrate and is in contact with the first electrode 201, and the first opening 205a is formed in the second electrode 202 at a position corresponding to the first conductive pillar 205, and the first via 205b is formed in the insulating layer 203 at a position that corresponds to the first conductive pillar 205. Further, the first via 205b penetrates the passivation layer 204, and the first conductive pillar 205 may be in contact with the first auxiliary electrode 111 through the first opening 205a in the second electrode 202 and the first via 205b in the passivation layer 204. Wherein, the first electrode 201 located on a side of the second electrode 202 facing away the first substrate, and the size of the first opening 205a in the second electrode 202 is larger than the size of the first via 205b in the insulating layer 203 and the passivation layer 204, so that the first conductive pillar 205 and the second electrode 202 are electrically insulated from each other.

In the present exemplary embodiment, referring to FIG. 5 in order to realize an electrical connection between another electrode of the storage capacitor Cs, for example, the second electrode 202, and the control terminal of the driving transistor 104, the manufacturing method may comprise the steps as described hereinafter.

A control transistor 105 is formed on the first substrate with the first terminal electrically connected to a control terminal of the driving transistor 104, and the second auxiliary electrode 112 in contact with first terminal of the control transistor 105. A second conductive pillar 206 is formed on the second substrate in contact with the second electrode 202, and contacting the second conductive pillar 206 with the second auxiliary electrode 112 by the fifth via that penetrates through the passivation layer 204. Wherein, the first electrode 201 is located on a side of the second electrode 202 facing away from the first substrate.

Based on the above description, the manufacturing method of the OLED display panel further comprises a protective layer 109 and a pixel defining layer 110 which are formed in sequence above the drive transistor 104 and the control transistor 105 of the first substrate. A third via VH3 and a fourth via VH4 are formed on the protective layer 109 and the pixel defining layer 110 respectively, so that the first auxiliary electrode 111 pass through the third via VH3 and be in contact with the first terminal of the driving transistor 104, and the second auxiliary electrode 112 may pass through the fourth via VH4 and be in contact with the first terminal of the control transistor 105.

In another exemplary embodiment, referring to FIG. 6, in order to realize an electrical connection between an electrode of the storage capacitor Cs, for example, the first electrode 201, and the first terminal of the driving transistor 104, the manufacturing method may comprise the steps as described hereinafter.

The first auxiliary electrode 111 is formed on the first substrate and is in contact with the first terminal of the driving transistor 104. The first pillar conductive 205 is formed on the second substrate and is in contact with the first electrode, and the first conductive pillar 205 is in contact with the first auxiliary electrode 111 through a six via that penetrates the passivation layer 204. Wherein, the first electrode 201 is located on a side adjacent to the second electrode 202.

In the present exemplary embodiment, referring to FIG. 7 in order to realize an electrical connection between another electrode of the storage capacitor Cs, for example, the second electrode 202, and the control terminal of the driving transistor 104, the manufacturing method may comprise the steps as described hereinafter.

A control transistor 105 is formed on the first substrate with its first terminal electrically connected to a control terminal of the driving transistor 104, and the second auxiliary electrode 112 is formed on the first substrate and is in contact with first terminal of the control transistor 105. The second pillar conductive 206 is formed on the second substrate and is in contact with the second electrode 202. The second opening 205c is formed in the first electrode 201 at a position that corresponds to that of the second conductive pillar 206. The second via 205d is formed in the insulating layer 203 at a position that corresponds to that of the second conductive pillar 206. The second via 205d penetrates the passivation layer 204, and the second conductive pillar 206 may pass through the second opening 205c in the first electrode 201 and the second via 205d in the passivation layer 204 so as to contact with the second auxiliary electrode 112. Wherein, the first electrode 201 located on a side of the second electrode 202 adjacent to the first substrate, and the size of the second opening 205c in the first electrode 201 is larger than the size of the second via 205d in the insulating layer 203 and the passivation layer 204, so that the second conductive pillar 206 and the first electrode 201 are electrically insulated from each other.

Optionally, in the present embodiment, when the first electrode 201 and the second electrode 202 are formed, the two electrodes may be formed as a plurality of electrically connected block electrodes. That is, a plurality of electrically connected block electrodes are formed on the second substrate to constitute the first electrode 201, and a plurality of electrically connected block electrodes are formed above the insulating layer 203 opposite to the respective block electrodes of the first electrode 201 to constitute the second electrode 202.

The manufacturing method of the OLED display panel in the technical proposal of the present disclosure will be exemplarily described below with reference to the accompanying figures.

In an exemplary embodiment, as shown in FIG. 4, the manufacturing method of the OLED display panel may comprise the following three parts.

The manufacturing method of the array substrate 10 comprises the following steps. Firstly, an active layer, a gate insulating layer, a gate electrode, an interlayer insulating layer, a source electrode and a drain electrode are formed on the first substrate in sequence, thereby obtaining the driving transistor 104, and a protective layer 109 comprising the third via VH3 and the seventh via is formed above the driving transistor 104. Secondly, a third electrode 101 is formed above the protective layer 109, and the third electrode 101 may be electrically connected to the drain electrode of the driving transistor 104 by the seventh via in the protective layer 109. Then, a pixel defining layer 110 comprising the third via VH3 is formed above the third electrode 101 to obtain a plurality of regions for filling the organic light-emitting material, and the organic light-emitting layer 103 is manufactured in the plurality of regions defined by the pixel defining layer 110 by using, for example, evaporation method. Finally, a fourth auxiliary electrode 102 and a first auxiliary electrode 111 are formed above the pixel defining layer 110 and the organic light-emitting layer 103, and the first auxiliary electrode 111 may be electrically connected to the source electrode of the driving transistor 104 by the third via VH3 in the protective layer 109 and the pixel defining layer 110. The source electrode of the driving transistor 104 may be integrated with the power signal lines 108.

The manufacturing method of the package substrate 20 may comprise the following steps. Firstly, the first electrode 201 is formed on the second substrate, and the insulating layer 203 is formed above the first electrode 201. Then, the second electrode comprising the first opening 205a is formed above the insulating layer 203, and the passivation layer 204 is formed above the second electrode 202. Next, the first via 205b is formed in the passivation layer 204 and the insulating layer 203, and a radius of the first opening 205a in the second electrode 202 is larger than a radius of the first via 205b in the passivation layer 204 and the insulating layer 203. Finally, the first conductive pillar 205 is formed above the passivation layer 204, and the first conductive pillar 205 may pass through the first opening 205a in the second electrode 202 and the first via 205b in the insulating layer 203 and the passivation layer 204 so as to be electrically connected to the first electrode 201, and electrically insulated from the second electrode 202.

Based on this, the packaging method of the OLED display panel may further comprise, applying the encapsulant 30 on the peripheral region of the array substrate 10, and compressing the array substrate 10 and the package substrate 20, so that the first conductive pillar 205 is in contact with the source electrode of the driving transistor 104, the encapsulant 30 is solidified by ultraviolet light irradiation, thereby completing the packaging of the OLED display panel.

It should be noted that, "above" in the present disclosure is explained based on the sequence of the manufacturing process, that is the structure formed first is below the structure formed later, and that has no absolute relationship with the upper and lower relative positions shown in the accompanying figures.

In another exemplary embodiment, as shown in FIG. 5, the manufacturing method of the OLED display panel may comprise the following three parts.

The manufacturing method of the array substrate 10 comprises the following steps. Firstly, an active layer, a gate insulating layer, a gate electrode, an interlayer insulating layer, a source electrode and a drain electrode are formed in sequence on the first substrate, thereby obtaining the control transistor 105, and a protective layer 109 comprising the fourth via VH4 is formed above the control transistor 105. Next, a pixel defining layer 110 comprising the fourth via VH4 is formed above the protective layer 109. Finally, a second auxiliary electrode 112 is formed above the pixel defining layer 110, and the second auxiliary electrode 112 may be electrically connected to the drain electrode of the control transistor 105 by the fourth via VH4 in the protective layer 109 and the pixel defining layer 110. The source electrode of the control transistor 105 may be integrated with the data signal lines 107.

The manufacturing method of the package substrate 20 may comprise the following steps. Firstly, the first electrode 201, the insulating layer 203 and the second electrode 202 are formed in sequence on the second substrate. Then, the passivation layer 204 comprising the fifth via is formed above the second electrode 202. Finally, the second conductive layer 206 is formed above the passivation layer 204, and the second conductive layer 206 may be electrically connected to the second electrode 202 by the fifth via in the passivation layer 204.

Based on this, the packaging method of the OLED display panel may further comprise, applying the encapsulant 30 on the peripheral region of the array substrate 10, and compressing the array substrate 10 and the package substrate 20, so that the second conductive pillar 206 is in contact with the drain electrode of the control transistor 105. The encapsulant 30 is solidified by ultraviolet light irradiation, thereby completing the packaging of the OLED display panel.

It should be noted that, "above" in the present disclosure is explained based on the sequence of the manufacturing process, that is, the structure formed first is below the structure formed later, and that has no absolute relationship with the upper and lower relative positions shown in the accompanying figures.

It should be noted that the above two exemplary embodiments are described by taking a cross-sectional view of different cross sections in FIG. 3 as an example. FIG. 4 is a cross-sectional view of the A-A cross section of the driving transistor 104, and FIG. 5 is a cross-sectional view of the B-B cross section of the control transistor 105. Therefore, the two embodiments may include repeating structures, and description of partial structures may be omitted due to the viewing angle problem, which will not be exhausted herein. In addition, in other exemplary embodiments such as the embodiment shown in FIG. 5 and FIG. 6, FIG. 5 is a cross-sectional view of the A-A cross section of the driving transistor 104, and FIG. 6 is a cross-sectional view of the B-B cross section of the control transistor 105. Therefore, the two embodiments will also include repeated structures and description of partial structures may be omitted due to the viewing angle problem, and will not be deliberated herein.

It should be noted that the details of the manufacturing method of the OLED display panel have been described in detail in the corresponding OLED display panel, and details are not described again herein.

The exemplary embodiment also provides an OLED display device comprising the above OLED display panel.

Wherein, the OLED display device may comprise, for example, a mobile phone, a tablet computer, a television, a notebook computer, a digital photo frame, a navigator, etc., and any product or component with a display function, which is not specifically limited in the present disclosure.

Other embodiments of the present disclosure will be readily contemplated by those skilled in the art after considering the specification and practicing the present disclosure herein. The present application is intended to cover any variations, uses, or adaptations of the present disclosure, which are in accordance with the general principles of the present disclosure and comprise common general knowledge or conventional technical means in the art that are not disclosed in the present disclosure. The specification and embodiments are only regarded as illustrative and the true scope and essence of the present disclosure are indicated by the appended claims.

It is to be understood that the present disclosure is not limited to precise structures that has been described above and shown in accompany figures. The scope of the disclosure is to be limited only by the appended claims.

What is claimed is:

1. A display panel, comprising:
    an array substrate and a package substrate provided opposite to each other, the array substrate comprising a plurality of pixel units arranged in an array, and at least one of the pixel units comprising a driving transistor,
    a first electrode and a second electrode provided between the package substrate and the array substrate; and
    an insulating layer provided between the first electrode and the second electrode,
    wherein, the first electrode is electrically connected to a first terminal of the driving transistor, and the second electrode is electrically connected to a control terminal of the driving transistor,
    the array substrate further comprises a first auxiliary electrode electrically connected to the first terminal of the driving transistor,
    the package substrate further comprises a first conductive pillar electrically connected to the first electrode, wherein the first conductive pillar is electrically connected to the first auxiliary electrode,
    the array substrate further comprises a protective layer and a pixel defining layer provided in sequence above the driving transistor, and
    wherein the first auxiliary electrode is in contact with the first terminal of the driving transistor through a third via that penetrates the protective layer and the pixel defining layer.

2. The display panel according to claim 1, wherein, the first electrode and the second electrode form a storage capacitor.

3. The display panel according to claim 1, wherein,
    the first electrode is provided on the package substrate, and the second electrode is located on a side of the first electrode adjacent to the array substrate,
    the second electrode is provided with a first opening at a position of the first conductive pillar, and the insulating layer is provided with a first via at a position corresponding to the first conductive pillar, the first conductive pillar being in contact with the first auxiliary electrode through the first opening and the first via,
    wherein a size of the first opening is larger than a size of the first via, so that the first conductive pillar and the second electrode are electrically insulated.

4. The display panel according to claim 1, wherein the second electrode is provided on the package substrate, and the first electrode is located on a side of the second electrode adjacent to the array substrate, and wherein the first conductive pillar is in contact with the first auxiliary electrode.

5. The display panel according to claim 1, wherein,
    the array substrate further comprises a control transistor of which a first terminal is electrically connected to the control terminal of the driving transistor, and a second auxiliary electrode that is in contact with the first terminal of the control transistor;
    the package substrate further comprises a second conductive pillar in contact with the second electrode, wherein, the second conductive pillar is electrically connected to the second auxiliary electrode.

6. The display panel according to claim 5, wherein, the first electrode is located on a side of the second electrode facing away from the array substrate, and the second conductive pillar is in contact with the second auxiliary electrode.

7. The display panel according to claim 5, wherein, the first electrode is located on a side of the second electrode adjacent the array substrate, the first electrode is provided with a second opening at a position of the second conductive pillar, and the insulating layer is provided with a second via at a position corresponding to the second conductive pillar, wherein the second conductive pillar is in contact with the second auxiliary electrode through the second opening and the second via, wherein a size of the second opening is larger than a size of the second via, so that an electrical connection between the second conductive pillar and the first electrode is electrically insulated.

8. The display panel according to claim 5, wherein, the at least one of the pixel units further comprise a third electrode electrically connected to a second terminal of the driving transistor and a fourth electrode provided opposite to the third electrode, and
    wherein, the second auxiliary electrode is provided in a same layer as the fourth electrode.

9. The display panel according to claim 5, wherein, the array substrate further comprises the protective layer and the pixel defining layer provided in sequence above the driving transistor, and
    wherein the second auxiliary electrode is in contact with the first terminal of the control transistor through a fourth via that penetrates the protective layer and the pixel defining layer.

10. The display panel according to claim 5, wherein, the array substrate further comprises a plurality of scanning signal lines arranged along a first direction and a plurality of data signal lines and power signal lines arranged along a second direction, the first direction being perpendicular to the second direction, and
    wherein, a control terminal of the control transistor is electrically connected to the scanning signal lines, and a second terminal of the control transistor is electrically connected to the data signal lines, and the first terminal of the driving transistor is further electrically connected to the power signal lines.

11. The display panel according to claim 1, wherein, the at least one of the pixel units further comprises a third electrode electrically connected to a second terminal of the driving transistor and a fourth electrode provided opposite to the third electrode, and
    wherein, the first auxiliary electrode is provided in a same layer as the fourth electrode.

12. A display device, comprising a display panel according to claim 1.

* * * * *